United States Patent
Dote

(10) Patent No.: US 10,388,632 B2
(45) Date of Patent: Aug. 20, 2019

(54) SEMICONDUCTOR DEVICE AND METHOD OF MANUFACTURING THE SAME

(71) Applicant: FUJITSU LIMITED, Kawasaki-shi, Kanagawa (JP)

(72) Inventor: Aki Dote, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/005,015

(22) Filed: Jun. 11, 2018

(65) Prior Publication Data

US 2018/0366445 A1 Dec. 20, 2018

(30) Foreign Application Priority Data

Jun. 14, 2017 (JP) ................. 2017-116403

(51) Int. Cl.
*H01L 21/02* (2006.01)
*H01L 25/065* (2006.01)
*H01L 25/00* (2006.01)
*H01L 21/8238* (2006.01)
*H01L 29/04* (2006.01)
*H01L 23/528* (2006.01)
*H01L 23/522* (2006.01)
*H01L 23/48* (2006.01)
*H01L 23/00* (2006.01)

(52) U.S. Cl.
CPC .. *H01L 25/0657* (2013.01); *H01L 21/823871* (2013.01); *H01L 25/50* (2013.01); *H01L 29/045* (2013.01); *H01L 23/481* (2013.01); *H01L 23/528* (2013.01); *H01L 23/5226* (2013.01); *H01L 24/13* (2013.01); *H01L 2224/0401* (2013.01); *H01L 2224/0557* (2013.01); *H01L 2224/05573* (2013.01); *H01L 2224/13082* (2013.01); *H01L 2224/13111* (2013.01); *H01L 2224/13139* (2013.01); *H01L 2224/13147* (2013.01); *H01L 2225/06541* (2013.01); *H01L 2225/06565* (2013.01); *H01L 2225/06582* (2013.01); *H01L 2924/3511* (2013.01)

(58) Field of Classification Search
CPC ......... H01L 21/02027; H01L 21/02433; H01L 21/02516; H01L 21/02609; H01L 29/4925; H01L 29/04; H01L 29/045; H01L 25/043; H01L 25/0657; H01L 25/0756; H01L 25/117
See application file for complete search history.

(56) References Cited

U.S. PATENT DOCUMENTS 6,821,826 B1 * 11/2004 Chan ................ H01L 21/6835
257/74
2006/0043571 A1 * 3/2006 Mousa ............... H01L 25/0657
257/700
2008/0158483 A1 * 7/2008 Saitoh .................. B32B 7/02
349/96

(Continued)

FOREIGN PATENT DOCUMENTS

JP 2001-094039 4/2001
JP 2007-234725 9/2007

*Primary Examiner* — Jae Lee
(74) *Attorney, Agent, or Firm* — Fujitsu Patent Center

(57) ABSTRACT

A semiconductor device includes, a plurality of semiconductor dies formed using semiconductor substrates, plane orientations of which are the same, and the plurality of the semiconductor dies are stacked such that a crystal orientation of at least one layer is different from other layers.

12 Claims, 17 Drawing Sheets

(56) References Cited

U.S. PATENT DOCUMENTS

2010/0136306 A1* 6/2010 Adachi .................. B32B 15/01
                                                    428/212
2017/0307796 A1* 10/2017 Boone ..................... C08B 3/16
2019/0006171 A1* 1/2019 Dasgupta ............. H01L 23/481

* cited by examiner

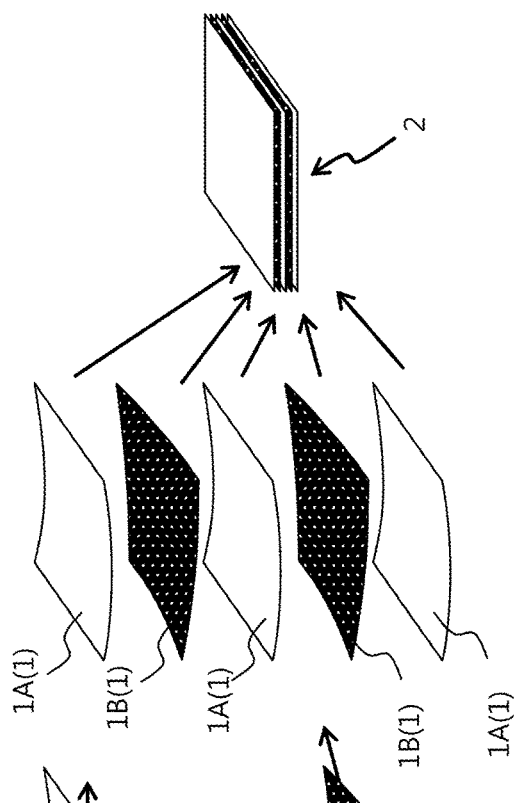

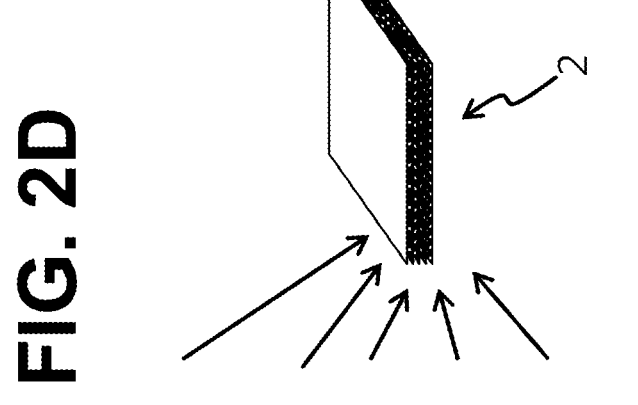
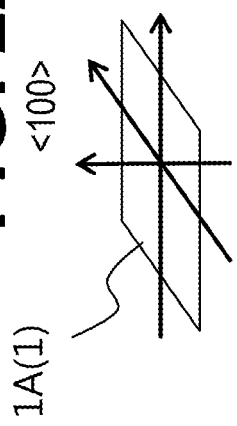
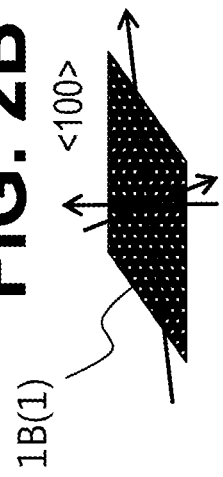
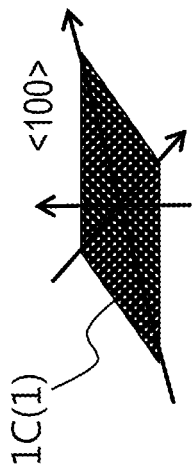

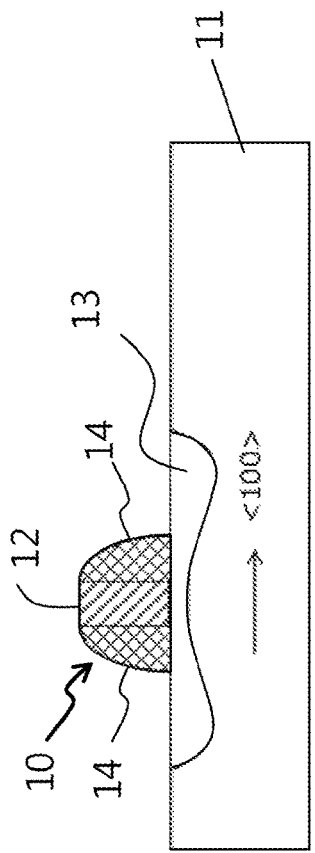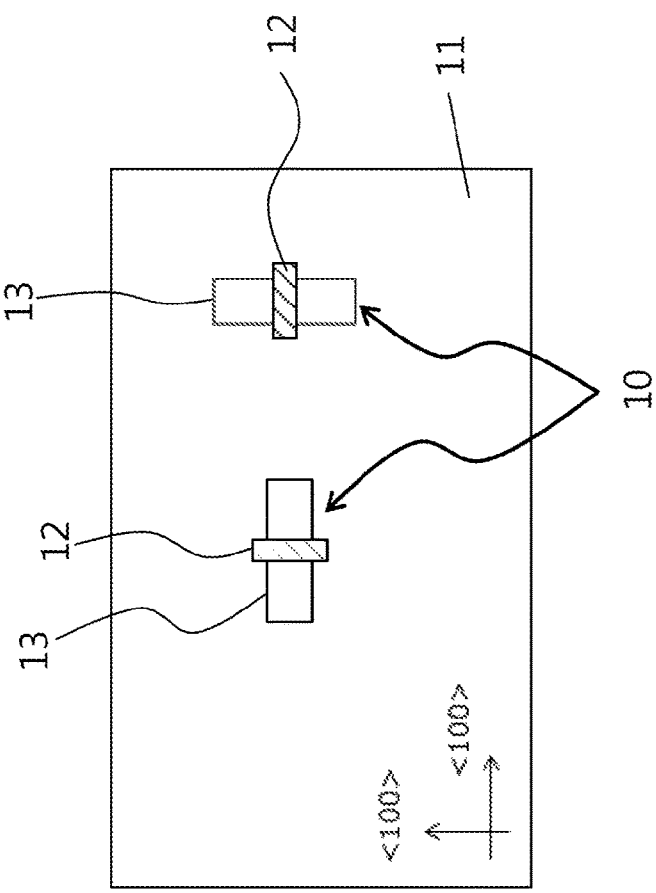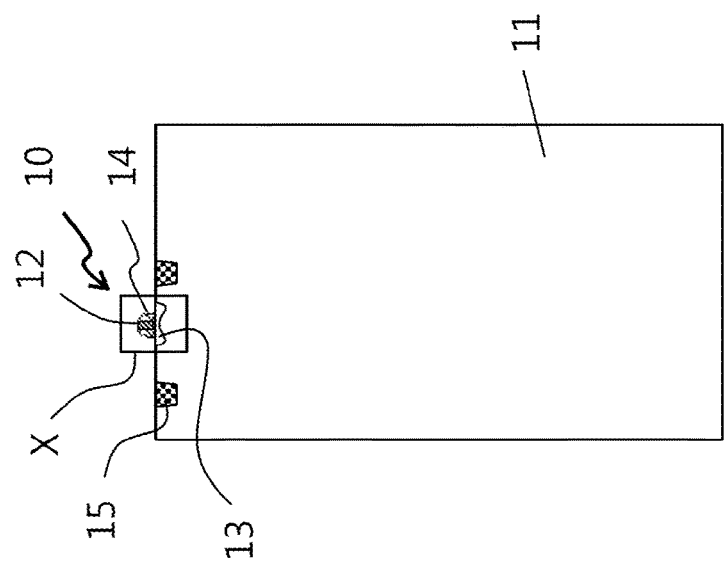

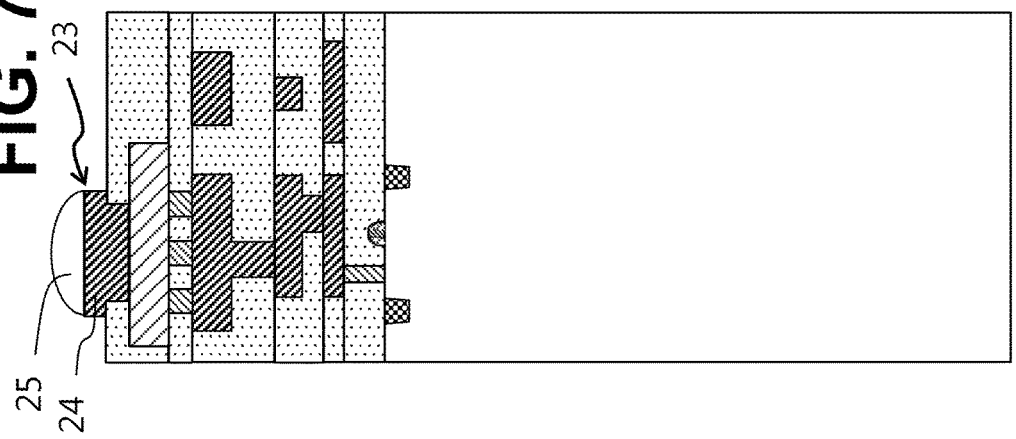
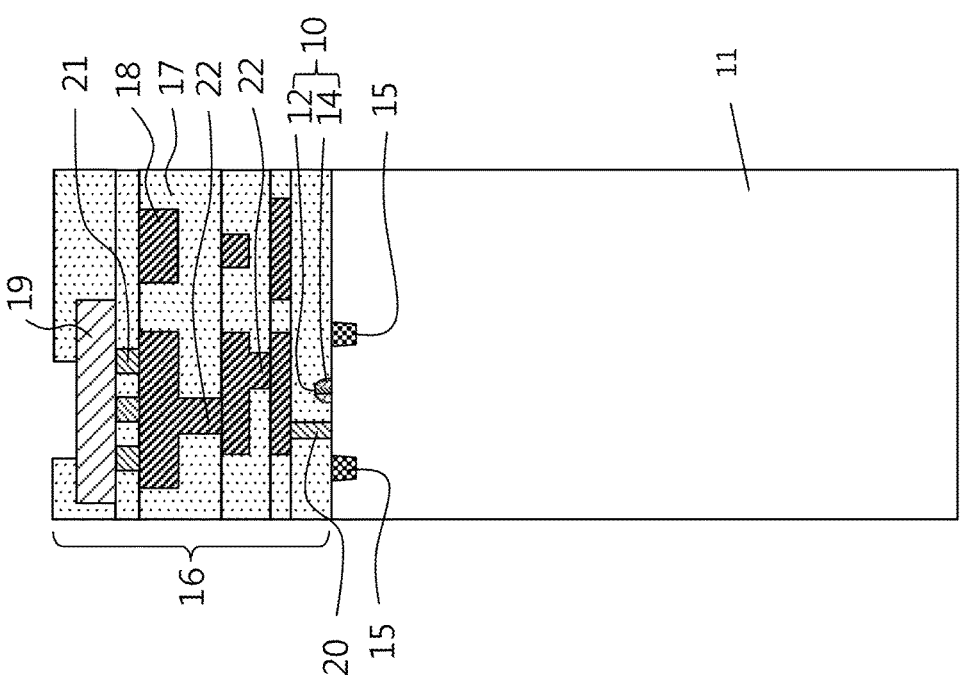

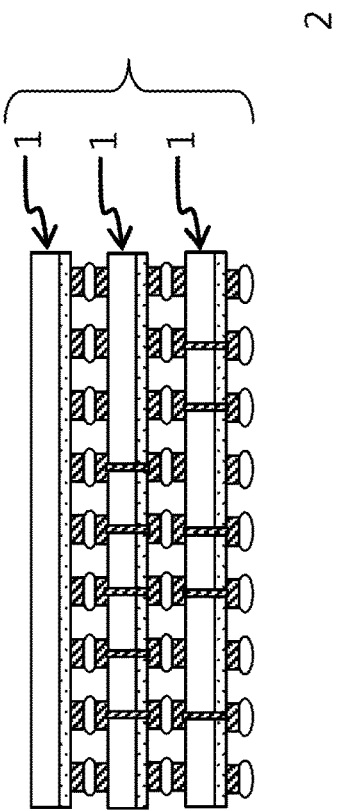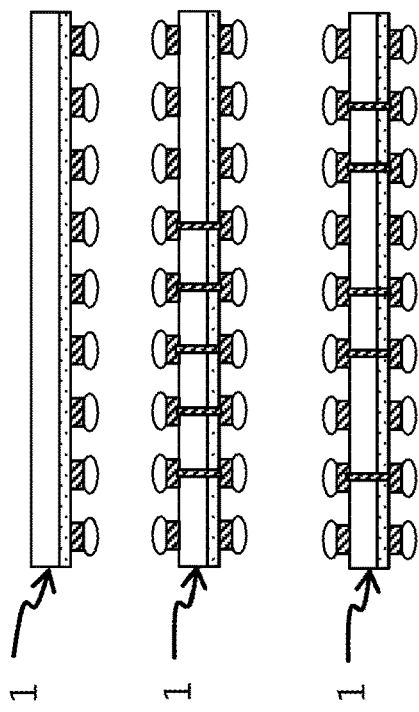

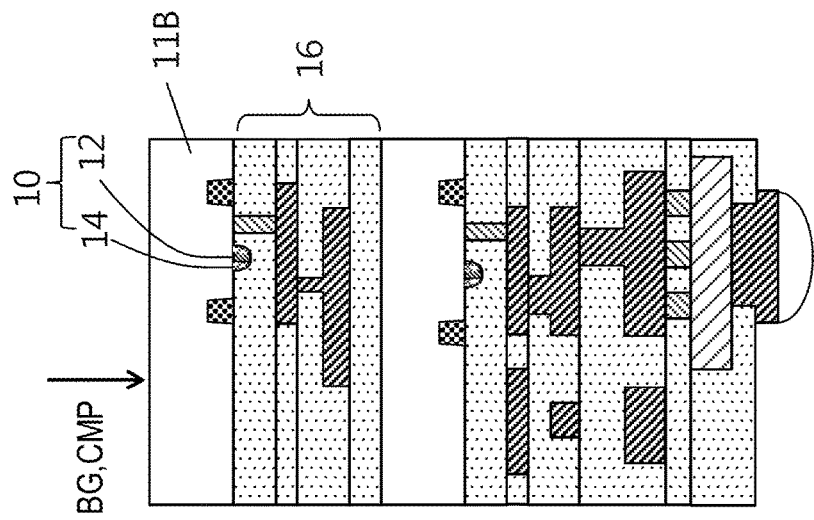
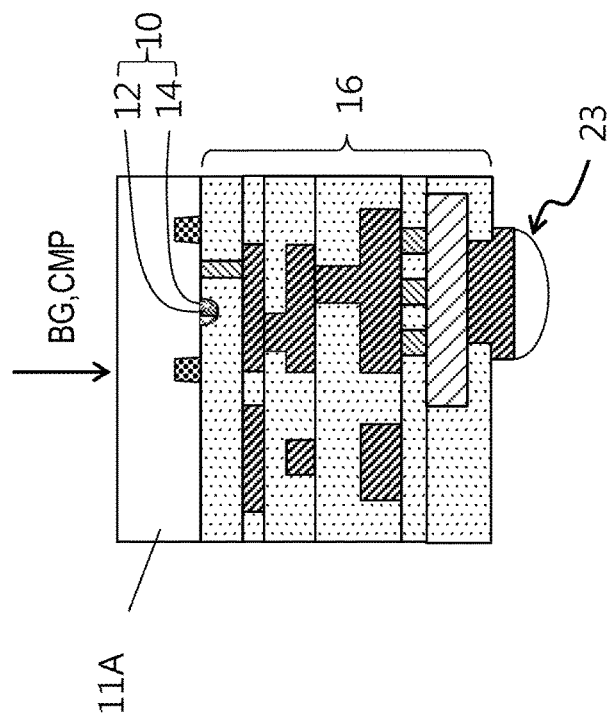
FIG. 13A
FIG. 13B

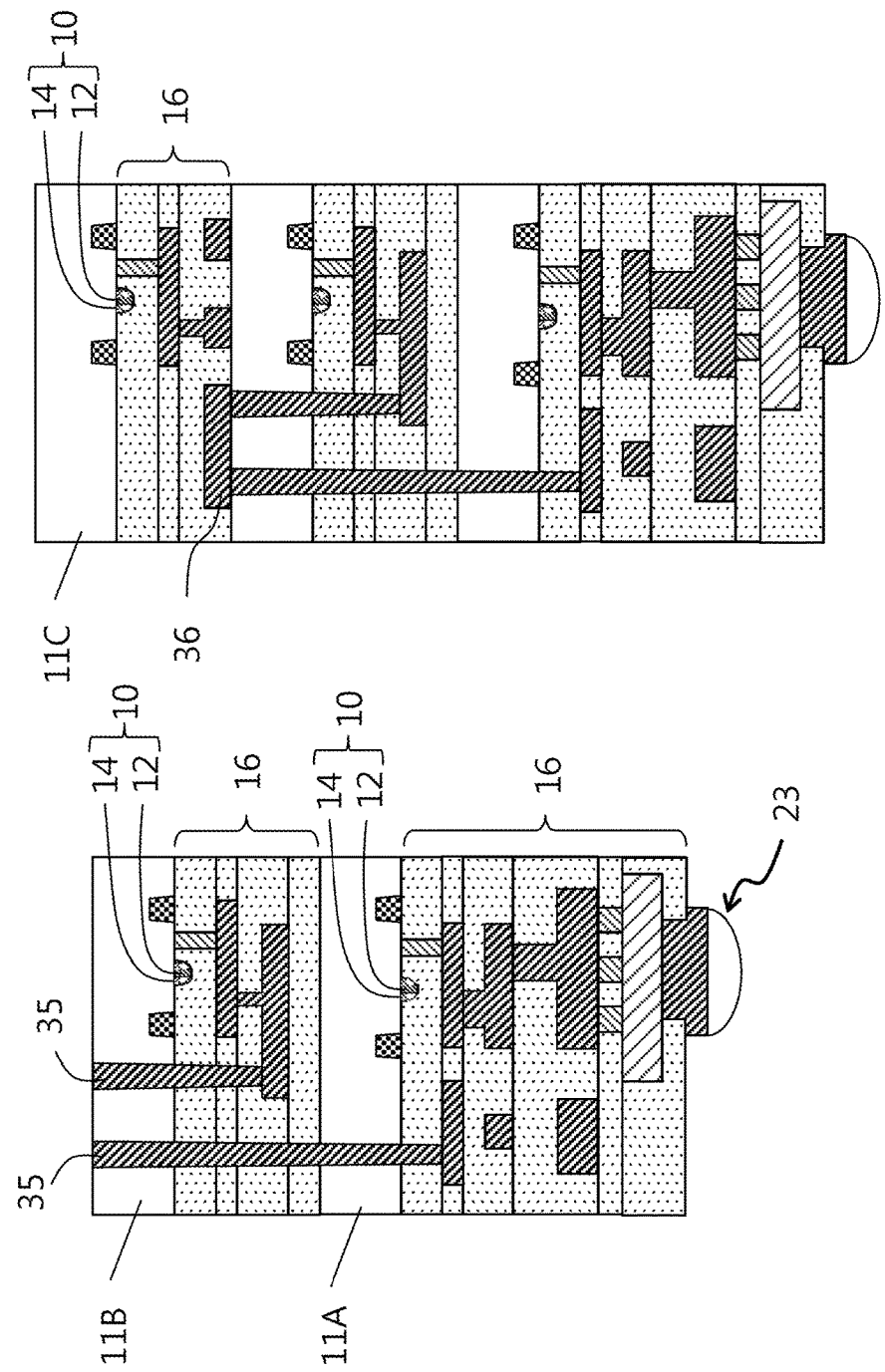

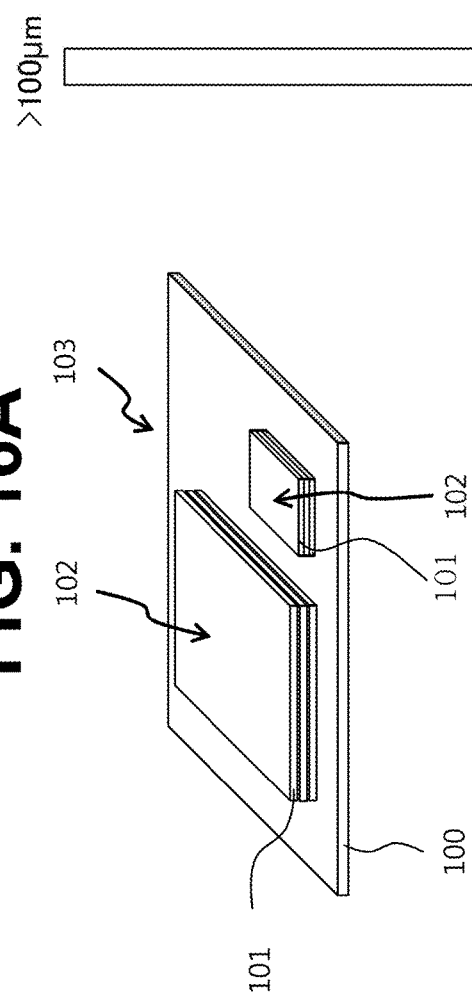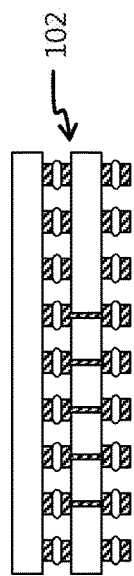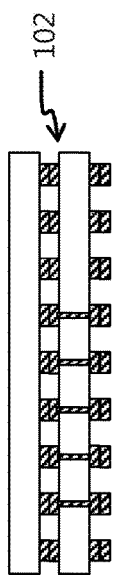

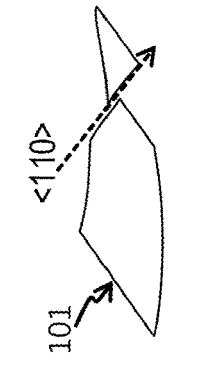
FIG. 17A
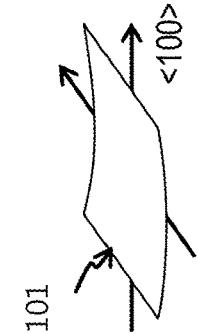
FIG. 17B
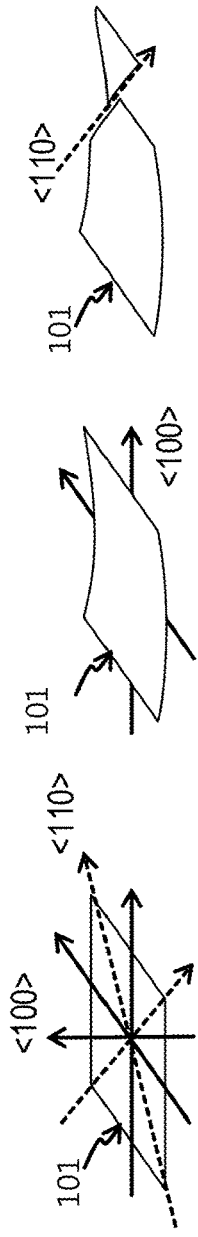
FIG. 17C   FIG. 17D   FIG. 17E
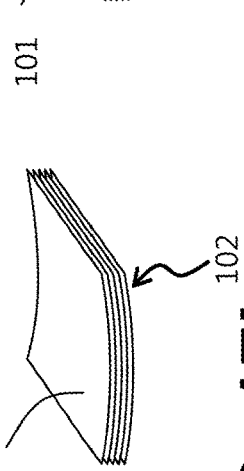
FIG. 17F   FIG. 17G   FIG. 17H
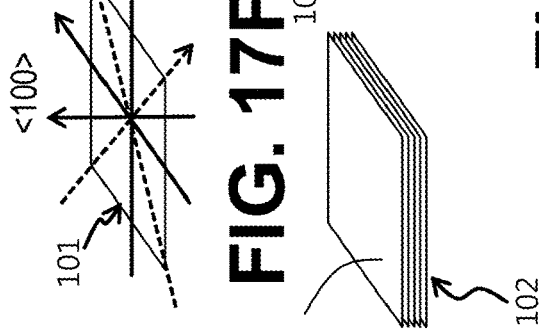
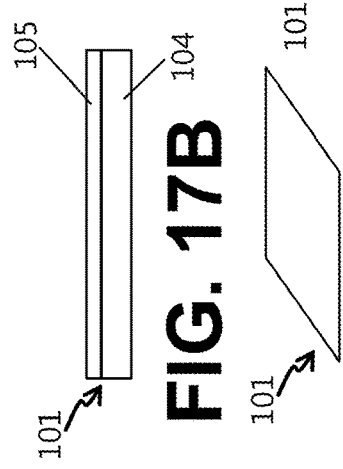
FIG. 17I
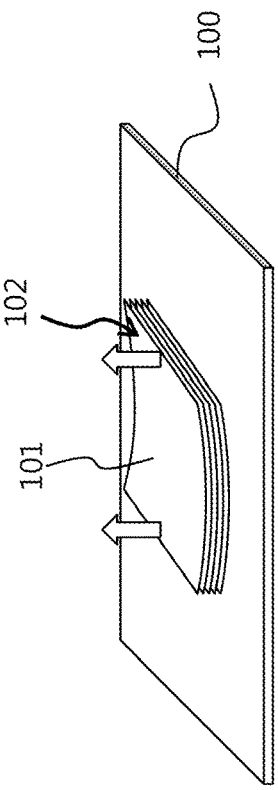

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2017-116403, filed on Jun. 14, 2017, the entire contents of which are incorporated herein by reference.

FIELD

The embodiments discussed herein are related to a semiconductor device and a method of manufacturing a semiconductor device.

BACKGROUND

In the related art, high performance of a semiconductor device has been achieved through miniaturization of the semiconductor itself, but reached the limit in terms of physical limitation, an increase of cost, and power consumption. As an alternative technology, a three-dimensional mounting structure which achieves high performance of a device without performing miniaturization by stacking a plurality of thinned semiconductors is practically used as, for example, memory or a CMOS image sensor (CIS).

Related technologies are disclosed in, for example, Japanese Laid-Open Patent Publication Nos. 2007-234725 and 2001-094039.

SUMMARY

According to an aspect of the embodiments, a semiconductor device includes, a plurality of semiconductor dies formed using semiconductor substrates, plane orientations of which are the same, and the plurality of the semiconductor dies are stacked such that a crystal orientation of at least one layer is different from other layers.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 1A to 1E are schematic views illustrating a configuration of a semiconductor device according to an embodiment;

FIGS. 2A to 2D are schematic views illustrating a configuration of a semiconductor device according to an embodiment;

FIGS. 4A and 4B are views illustrating a deformation simulation model of a stacked device in which semiconductor dies are stacked in three layers, in which FIG. 4A is a sectional view and FIG. 4B is a perspective view illustrating the stacked state;

FIGS. 6A to 6C are schematic views for describing a method of manufacturing a semiconductor device according to an embodiment, in which FIG. 6A is a sectional view, FIG. 6B is a sectional view exaggeratedly illustrating an area denoted by X, and FIG. 6C is a plane view;

FIGS. 7A and 7B are schematic sectional views for describing a method of manufacturing a semiconductor device according to an embodiment;

FIGS. 9A and 9B are schematic views for describing a method of manufacturing a semiconductor device according to an embodiment, in which FIG. 9A is a plane view, and FIG. 9B is a plane view exaggeratedly illustrating a part of FIG. 9A;

FIGS. 10A and 10B are schematic views for describing a method of manufacturing a semiconductor device according to an embodiment, in which FIG. 10A is a plane view and FIG. 10B is a plane view exaggeratedly illustrating a part of FIG. 10A;

FIGS. 11A and 11B are schematic sectional views for describing a method of manufacturing a semiconductor device according to an embodiment;

FIGS. 12A and 12B are schematic views for describing a method of manufacturing a semiconductor device according to an embodiment, in which FIG. 12A is a perspective view and FIG. 12B is a sectional view;

FIGS. 13A and 13B are schematic sectional views for describing a modified example of a method of manufacturing a semiconductor device according to the present embodiment;

FIGS. 14A and 14B are schematic sectional views for describing a modified example of a method of manufacturing a semiconductor device according to a present embodiment;

FIGS. 16A to 16E are schematic views for describing the thinning of a substrate in a stacked device in which a plurality of semiconductor dies is stacked; and FIGS. 17A to 17I are schematic views for describing a problem of the present disclosure, in which FIG. 17A is a sectional view, and FIGS. 17B to 17I are perspective views.

DESCRIPTION OF EMBODIMENTS

Figure 3:
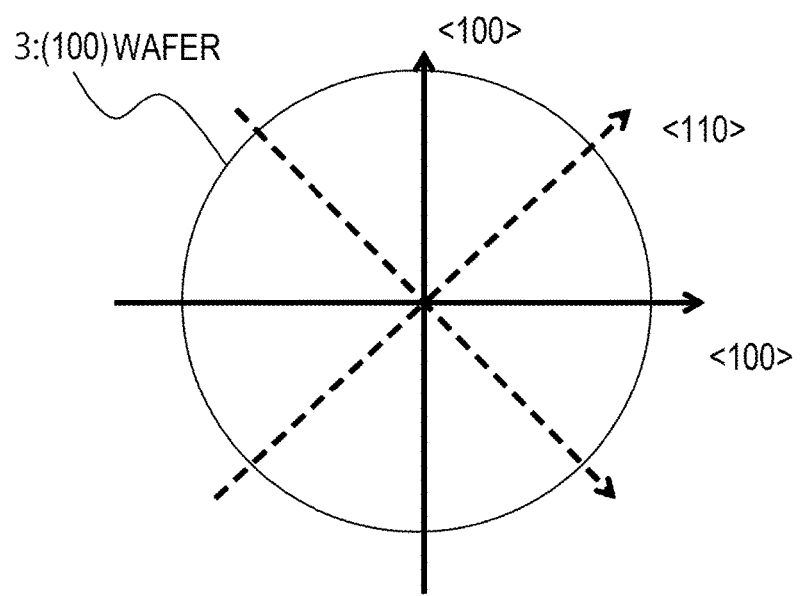
FIG. 3 is a view illustrating a <100> orientation and a <110> orientation in a SI wafer having a (100) plane orientation.

Meanwhile, as illustrated in FIG. 16A, there is a semiconductor device 103 including a stacked device 102 in which a plurality of semiconductor dies 101 is stacked on, for example, a package substrate (PKG) or an interposer (IP) 100. The stacked device 102 may have, for example, a structure in which semiconductor dies are stacked with, for example a die attach film or the like interposed therebetween and are joined through wire bonding as illustrated in FIG. 16B (e.g., a memory or the like), a structure in which a semiconductor die having Through Silicon Via (TSV) is joined by a solder bump as illustrated in FIG. 16C (e.g., Hybrid Memory Cube (HMC) or the like), and a structure in which a semiconductor die having a TSV is, for example, directly joined (direct bonding) with a pillar such as Cu or the like as illustrated in FIG. 16D (e.g., CIS or the like).

As a method for further increasing density, a method has been reviewed in which semiconductor dies or wafers are stacked and then bonded to each other using, for example, vias formed through etching or the like. In order to achieve high density and high integration of a device, since a plurality of semiconductor dies is stacked, it is required to thin the substrates of the semiconductor dies. However, when the substrates of the semiconductor dies are thinned, the substrates are likely to be deformed and warped (see, e.g., FIG. 17D). This also applies to the case where a plurality of semiconductor dies is stacked (see, e.g., FIG. 17G). As a result, for example, defective joining or the like is caused when mounting on a package substrate or an interposer, and reliability also deteriorates due to disconnection of joining or the like by stress after the mounting (see, e.g., FIG. 17I).

Hereinafter, a semiconductor device and a method of manufacturing the semiconductor device will be described with reference to FIGS. 1A to 17I. As illustrated in FIGS. 1A to 1E and FIGS. 2A to 2D, a semiconductor device according to the present embodiment includes a plurality of semiconductor dies 1 (1A, 1B or 1A to 1C) using semiconductor substrates the plane orientations of which are the same. The plurality of semiconductor dies 1 (1A, 1B or 1A to 1C) is stacked such that the crystal orientation of at least one layer is different. That is, the plurality of semiconductor dies 1 is manufactured such that the crystal orientation of the substrate of at least one semiconductor die is different from those of the others.

In addition, FIGS. 1A to 1E illustrate a case where two types of semiconductor dies having different crystal orientations are alternately stacked in 5 layers by way of an example, and FIGS. 2A to 2D illustrate a case where three types of semiconductor dies having different crystal orientations are alternately stacked in 5 layers by way of an example. However, the number of the semiconductor dies having different crystal orientations and the number of the layers are not limited to these cases.

As a result, it is possible to suppress warping of a stacked die 2 having a plurality of stacked semiconductor dies 1.

That is, by rotating at least one layer of stacked semiconductor dies in a plane such that crystal orientation of the at least one layer is different from the others as will be described later, the nature of being easily deformed in a specific direction is suppressed and deformation of the stacked die 2 may be reduced, so that it is possible to suppress warping of the stacked die 2. As a result, it is possible to realize the stacked die 2 that suppresses yield or reliability from deteriorating due to defective joining.

Further, by manufacturing the stacked semiconductor dies such that the crystal orientation of at least one layer of the stacked semiconductor dies 1 is different from the others, the cleavage directions of the substrates may not coincident with each other. Therefore, it is possible to suppress the stacked die 2 from broken in the cleavage directions of the substrates. The semiconductor device according to the present embodiment is, for example, a semiconductor device including a stacked device (stacked die) 2 having a plurality of semiconductor dies 1 stacked on a package substrate (PKG) or an interposer (IP) 33 (see e.g., FIGS. 12A and 12B).

Here, in the mounting structure of the semiconductor device, the substrates of the plurality of semiconductor dies 1 stacked are thinned, and a stacked device obtained by stacking the plurality of thinned semiconductor dies 1 is mounted. Further, in the present embodiment, the semiconductor substrate is a (100) plane Si substrate. Here, since a (100) plane Si wafer 3 as illustrated in FIG. 3 is used, and the semiconductor dies 1 are separated through dicing or the like as described later, the semiconductor substrates constituting the semiconductor dies 1 are (100) plane Si substrates. Further, in the (100) plane Si wafer 3, a <100> orientation or a <110> orientation is arbitrary in a plane, but in the present embodiment, the <100> orientation is an up and down, and a left and right direction as illustrated in FIG. 3, and the <110> orientation is a diagonal direction of 45° with respect to the <100> orientation.

A plurality of semiconductor dies 1 is manufactured and stacked in a state in which the in-plane <100> orientation of at least one layer is rotated by 15° to 45° with respect to the other layers. Particularly, at least one layer may be manufactured in a state in which the in-plane <100> orientation is rotated with respect to another layer by 45°, and may be stacked on a convex side of warping. Further, a structure in which a rotating direction for each layer is arbitrary may be used.

In this manner, by stacking the semiconductor dies manufactured such that the directions in which the in-plane elastic moduli of the semiconductor dies 1 are low (here, the <100> orientation of the semiconductor dies 1 using (001) plane Si substrates) are not coincident with each other in the plurality of semiconductor dies 1 constituting the stacked die 2, it is possible to suppress the entire stacked die 2 from warping. Further, by stacking the semiconductor dies manufactured such that in-plane cleavage directions in which the semiconductor dies 1 are easily broken (here, the <110> orientation of the semiconductor dies 1 using (100) plane Si substrates) are not coincident with each other in the plurality of semiconductor dies 1 constituting the stacked die 2, it is possible to suppress the stacked die 2 from being broken.

In the present embodiment, the semiconductor dies 1 have, for example, a circuit including a transistor and a wiring layer (a multilayer wiring layer, a rewiring layer, or a BEOL) on a semiconductor substrate such as a Si substrate, and a plurality of semiconductors is thinned and then stacked. Here, the stacked semiconductor dies 1 may be connected to the outside by, for example, wire bonding, and may be joined using a TSV and a bump or direct bonding, and may be joined using a via formed through, for example, etching.

As described above, at least one layer of the plurality of semiconductor dies 1 is manufactured such that the in-plane <100> orientation thereof is rotated with respect to the other layers, but the transistor included in each of the plurality of semiconductor dies 1 is provided such that the channel of the transistor is directed along the <100> orientation. That is, each of the plurality of semiconductor dies 1 includes a transistor provided such that a channel is directed along the <100> orientation (see, e.g., FIGS. 6A to 6C).

In this case, the transistor included in at least one layer of the semiconductor die 1 rotated with respect to the other layers has a channel direction different from those of other transistors included in the semiconductor dies 1 of the other layers. However, it is possible to stack these semiconductor dies 1 by designing the wiring layer such that the channels are connected to each other. As described above, for example, even when the crystal orientations are not freely rotatable in terms of characteristics thereof, it is possible to stack the plurality of semiconductor dies 1 by manufacturing at least one layer of the plurality of semiconductor dies 1 in a rotated state.

The reason for configuration as described above is as follows. Since a plurality of semiconductor dies is stacked in order to achieve high density and high integration of a device, it is required to thin substrates (e.g., silicon substrates) constituting the semiconductor dies. For example, when joining substrates using TSV, it is required to thin the substrates to a thickness of about 100 μm or less, typically about several tens to 50 μm (see e.g., FIGS. 16C and 16D).

Further, for example, when joining substrates using vias, it is considered to thin the substrates to a thickness of about several μm (see, e.g., FIG. 16E).

However, when the thickness of the semiconductor dies becomes thin, the semiconductor dies are likely to be deformed or warped. Here, as the semiconductor substrates, for example, a single crystal substrate of Si, GaN, or the like, is used. However, in such a single crystal thin plate, a phenomenon called buckling is known in which the thin plate is largely deformed with a specific crystal orientation. Further, it is also known that the single crystal thin plate has a cleavage property that causes the thin plate to be broken in a specific direction.

The properties of these single crystal semiconductor substrates are the same in a semiconductor die having a circuit or the like formed thereon, and are also the same in a structure in which a plurality of semiconductor dies is stacked. For this reason, since a large warping is generated by buckling even in a device in which a plurality of semiconductor dies is stacked, which causes defective joining or the like when mounting the device on, for example, an interposer, a package substrate, a board, or the like, and also causes poor reliability due to disconnection by stress after mounting the device.

For example, when as a semiconductor die 101, CMOS transistors and multilayer wiring layer (BEOL) 105 are formed on a (100) plane Si Substrate 104 and the substrate is thinned as illustrated in FIGS. 17A and 17B, the semiconductor die 101 is deformed to have a concave shape on the BEOL side as illustrated in FIG. 17D not only due to the configuration of the BEOL, but also a difference in thermal expansion coefficient with Si. Further, when the size of the semiconductor die 101 is enlarged, the warping is easily generated.

Although the directions of the in-plane crystal axes in the (100) plane Si substrate 104 are arbitrary, the channels of CMOS transistors may be set in a <100> direction in the viewpoint of increasing an On-current of the CMOS transistors. In terms of designing, when the direction of the channel is set to the vertical and horizontal directions of the substrate, the directions of in-plane crystal axes are set as illustrated in FIG. 17C. In this case, when the semiconductor die 101 is manufactured from this substrate, the semiconductor die is often cut along the <100> direction.

Here, for example, the elastic modulus of the Si single crystal constituting the substrate of the semiconductor die 101 has a minimum value of about 130 GPA in the <100> direction, on the other hand, has a maximum value of about 169 GPA in a diagonal direction of the semiconductor die, i.e. in the <110> direction. Therefore, when the thickness of Si constituting the substrate is thin, the Si is greatly warped in the <100> direction, as illustrated in FIG. 17D. Further, since the <100> direction also exists in the direction rotated by 90°, the Si may also warp greatly in this direction. As illustrated in FIG. 17F, a stacked device 102 is formed by stacking a plurality of thin semiconductor dies, but even in the stacked device 102 having such a configuration, all the plurality of layers is deformed together, so that great warping is generated as well, as illustrated in FIG. 17G.

As illustrated in FIG. 17E, the Si single crystal has a property (cleavage) of being easily broken in the <110> direction. As illustrated in FIG. 17H, even in the stacked device 102 having a structure in which a plurality of layers is stacked, since the easily broken directions thereof are coincident with each other, the plurality of layers is broken at once when external force is applied thereto. Further, when mounting the stacked device 102 warped as described above is mounted on, for example, a package substrate (PKG) or an interposer (IP) 100 as illustrated in FIG. 17I, the stacked device 102 causes a defective joining, and also, causes deteriorated reliability due to disconnection of joining or the like by stress after mounting.

Such warping and breakage, as well as poor reliability or the like due to defective joining or stress concentration caused by the warping or breakage are problems, for example, in a 3D-LSI or the like. Therefore, a 3D-LSI or the like is configured as described above. Specifically, as illustrated in FIGS. 1A to 1E and FIGS. 2A to 2D, the semiconductor dies 1 (semiconductor dies 1A and 1B or semiconductor dies 1A to 1C) have, for example, a circuit including a transistor and a wiring layer on a semiconductor substrate such as a Si substrate or the like, and are thinned and then stacked. At least one layer of the plurality of semiconductor dies 1 is manufactured such that an in-plane <100> orientation thereof is rotated with respect to the other layers.

The transistor included in each of the plurality of semiconductor dies 1 is provided such that a channel thereof is directed along the <100> orientation (see, e.g., FIGS. 6A to 6C). As a result, it is possible to suppress a property of being easily deformed in a specific direction and to reduce the deformation of the stacked device 2, so that it is possible to suppress warping of the stacked device 2. As a result, it is possible to realize the stacked device 2 which suppresses a decrease of yield or reliability due to defective joining.

Further, since it is possible to make the cleavage directions of substrates not coincident with each other, it may be possible to suppress breakage of the stacked device 2 in the cleavage directions of the substrates. Here, FIG. 5 illustrates an analyzed result about deformation of stacked devices in which 3 layers of semiconductor dies are stacked by using stress simulation by the finite element method, using a model as illustrated in FIGS. 4A and 4B.

Figure 4A:
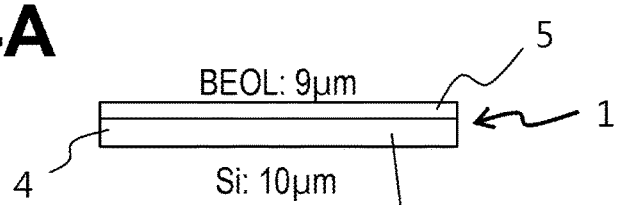
Figure 4B:
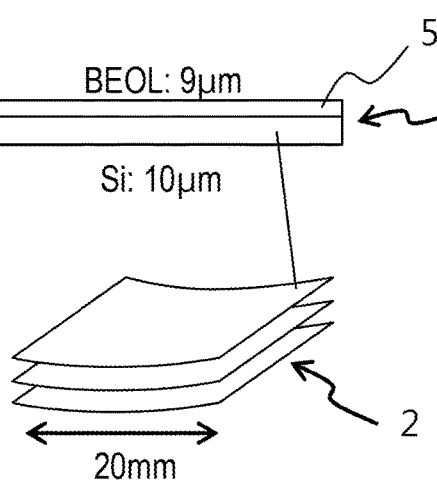

Here, a deformation amount of a stacked device 2 is measured using, as a model, for example, a stacked device 2 in which three layers of semiconductor dies 1, each including a Si substrate 4 with a side length of about 20 mm and a thickness of about 10 μm are stacked using a wiring layer (BEOL) 5 with a thickness of about 9 μm as a top side layer, as illustrated in FIGS. 4A and 4B. Further, here, a deformation amount is plotted for the rotated angle of the crystal orientation of the corresponding semiconductor die 1 in each of the manufactured stacked devices 2, for each a case where a stacked device 2 in which three layers of semiconductor dies are stacked is manufactured in the state in which the crystal orientation (here, the <100> orientation) of the uppermost semiconductor die 1 thereof is rotated (see triangle marks in FIG. 5), a case where a stacked device 2 is manufactured in the state in which the crystal orientation (here, the <100> orientation) of the semiconductor die 1 of the middle layer thereof is rotated (refer to rectangular marks in FIG. 5), and a case where a stacked device 2 is manufactured in the state in which the crystal orientation (here, the <100> orientation) of the lowermost semiconductor die 1 thereof is rotated (refer to diamond-shaped marks in FIG. 5). In addition, an angle of 0° refers to a case where any crystal orientations of the semiconductor dies are not rotated when manufacturing the semiconductor die.

Figure 5:
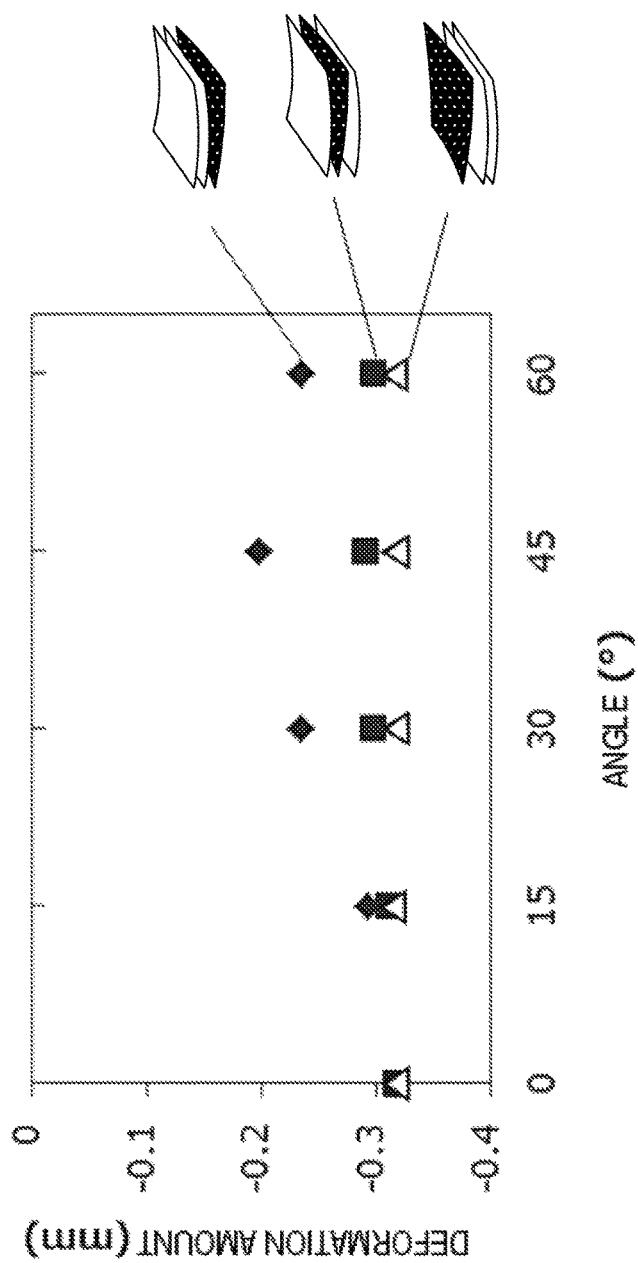
FIG. 5 is a view illustrating a result of simulation in respect of deformation of stacked devices in each of which semiconductor dies are stacked in three layers.

As a result of this deformation simulation, as illustrated in FIG. 5, it has been found that a deformation amount may be reduced in the case in which the stacked device 2 is manufactured in the state in which the crystal orientation of at least one of the plurality of semiconductor dies 1 is rotated with respect to the other layers. Especially, it has been found that in the case in which the stacked device 2 is manufactured in the state in which the crystal orientation of the lowest semiconductor die 1 (the <100> orientation in this case) is rotated, the deformation amount becomes smaller than in the other cases, whereby warping is effectively reduced.

That is, since the semiconductor die 1 is warped such that at a side in which the wiring layer 5 is formed is recessed, it has been found that warping is reduced most effectively in the case in which the stacked device 2 is manufactured in the state in which the crystal orientation (here, the <100> orientation) of the lowermost semiconductor die 1 at the convex side of warping is rotated. Further, when the rotated angle of the crystal orientation (here, the <100> orientation) of the semiconductor die 1 is set to 45°, it has been found that the deformation amount is the smallest, whereby warping is most effectively reduced.

Especially, it has been found that, when the stacked device 2 is manufactured in the state in which the crystal orientation of the lowermost semiconductor die 1 (here, the <100> orientation) is rotated by 45°, the deformation amount (warping; stress) may be reduced by about 60% compared with that in the case where the crystal orientation is not rotated. From the view point of breakage of the stacked semiconductor dies 1, it is considered that the case in which the stacked device 2 is manufactured in the state in which the lowermost semiconductor die 1 is rotated by 45° is the safest case because the semiconductor dies 1 are most hardly broken in that case.

Next, a method of manufacturing a semiconductor device according to the present embodiment is described. The method of manufacturing the semiconductor device according to the present embodiment includes manufacturing a plurality of semiconductor dies 1 using semiconductor substrates plane orientations of which are the same in such a manner that at least one layer has a different crystal orientation, and stacking the plurality of semiconductor dies 1. Specifically, in the stacking process, the plurality of semiconductor dies 1 each using a (100) plane Si substrate as a semiconductor substrate may be manufactured in a state in which the in-plane <100> orientation of at least one layer is rotated by 15° to 45° with respect to other layers, and the plurality of semiconductor dies may be stacked.

Especially, in the stacking process, at least one layer may be manufactured in a state in which the in-plane <100> orientation thereof is rotated by 45° with respect to other layers and positioned at a convex side of warping, and the plurality of semiconductor dies may be stacked. Further, in the present embodiment, before the stacking process, a manufacturing is included in which a plurality of semiconductor dies 1 having transistors provided such that a channel of the transistors is directed along the <100> orientation.

Hereinafter, the present disclosure will be described in detail with reference to FIGS. 6A to 12B. Here, descriptions will be made of a case where the thin Si semiconductor dies 1 having a through silicon via (TSV) 26 are joined using a bump (a solder bump) 23, by way of an example. First, as illustrated in FIGS. 6A to 6C, a circuit having CMOS transistors 10 is provided.

That is, a circuit having CMOS transistors 10 is formed on the front side of a Si wafer (Si substrate) 11. Here, for example, respective transistors (a pMOS transistor and an nMOS transistor) constituting the CMOS transistors 10 are formed each using a Si wafer 11 having a thickness of 775 μm and a (100) plane orientation by forming, for example, gates 12, channels 13, side walls 14, shallow trench isolations (STIs) 15.

Further, here, the respective transistors constituting the CMOS transistors 10 are provided such that the channels 13 are directed along the <100> orientation having high mobility. In the sectional view of a transistor in FIG. 6B, a left and right direction (a horizontal direction) is a direction aligned with the <100> orientation. Further, in the plane view in FIG. 6C, the horizontal direction is a direction aligned with the <100> orientation as in FIG. 6B, and an up and down direction (a vertical direction) is also a direction aligned with the <100> orientation.

Next, a wiring layer (BEOL) 16 is formed. That is, as illustrated in FIG. 7A, the wiring layer (multilayer wiring layer) 16 is formed by forming an insulating layer 17, a wiring 18, a pad 19, in sequence on the Si wafer 11 having a circuit formed thereon to include the CMOS transistors 10 as described above using, for example, chemical vapor deposition (CVD), etching, physical vapor deposition, electroplating, or the like.

Here, for example, Cu is used for the wiring 18, for example, Al is used for the pad 19, for example, tungsten is used for the channel 13 (see, e.g., FIGS. 6A to 6C), a contact via connected to a gate 12, and a contact via 21 directly underneath the Al pad 19, and Cu is used for other vias 22. Further, for example, SiO or SiN may be used for the insulating layer 17. Besides this, for example, a Low-k film of, for example, SiOC, SiOF, or the like may be used.

As described above, since respective transistors constituting the CMOS transistors 10 are formed such that the channels 13 are directed along the <100> orientation (see, e.g., FIGS. 6A to 6C), the wiring 18 is also basically provided to be directed along the <100> orientation. However, the wiring 18 may not be directed along the <100> orientation. Next, as illustrated in FIG. 7B, a bump 23 is formed in an opening provided in the upper side of the pad 19 using electro-plating or the like.

Here, a Cu pillar 24 is formed on the pad 19, a SnAg solder 25 is formed on the Cu pillar 24. The SnAg solder 25 is made to have a hemispherical shape through, for example, reflow or the like. Next, as illustrated in FIGS. 8A and 8B, the TSV 26 and a back side wiring layer 27 are formed.

Figure 8A:
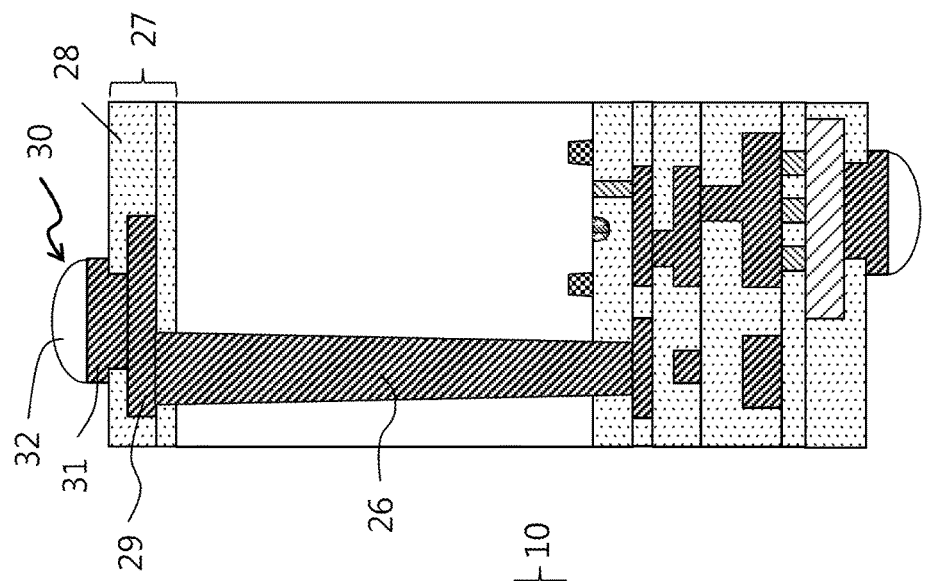
FIGS. 8A and 8B are schematic sectional views for describing a method of manufacturing a semiconductor device according to an embodiment.

As described above, the Si wafer 11 provided with a circuit including the CMOS transistors 10, the wiring layer 16, and the bump 23 is bonded to, for example, a support wafer (not illustrated) of, for example, Si or glass, using a temporary adhesive, and, as illustrated in FIG. 8A, the Si wafer (Si substrate) 11 is thinned from the back side. Here, the thickness of the Si wafer (Si substrate) 11 is thinned to, for example, about 50 μm using back grinding (BG) and chemical mechanical polishing (CMP).

Figure 8B:
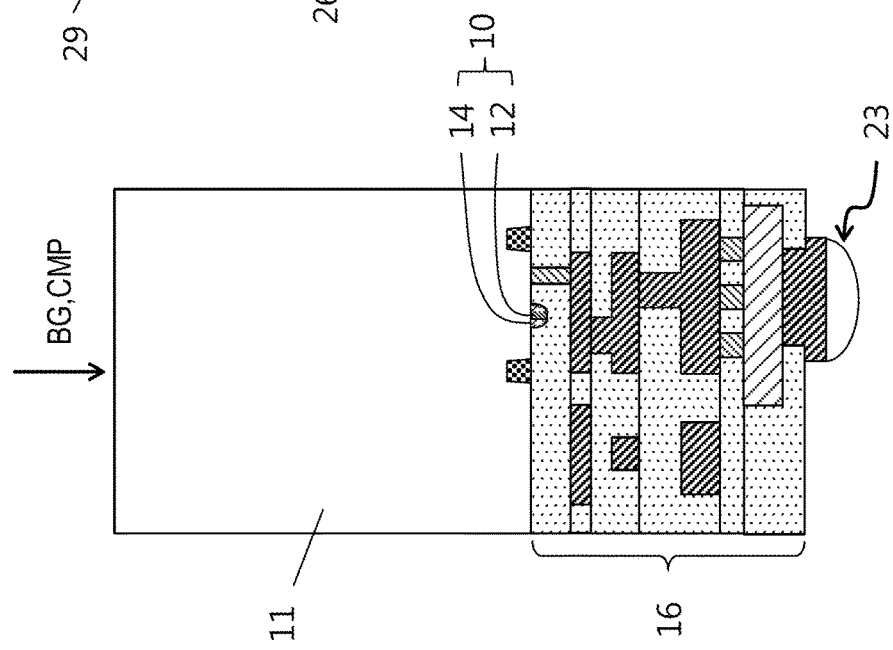

Next, as illustrated in FIG. 8B, on the support wafer, the TSV 26 is formed on the back side of the Si wafer and the back side wiring layer (back side rewiring surface) 27 is provided by forming an insulating layer 28 and a wiring 29 or the like. Then, a bump 30 is also formed on the back side as on the front side (device surface side) where the circuit including the CMOS transistors 10 and the wiring layer 16 are formed.

Here, for example, Cu is used for the TSV 26 and the wiring 29 constituting the back side wiring layer 27, and, for example, an organic insulating film of, for example, polyimide (PI) or polybenzoxazole (PBO) is used for the insulating layer 28. In the bump 30, a SnAg solder 32 is formed on a Cu pillar 31, and the SnAg solder 32 is formed in a hemispherical shape. Next, as illustrated in FIGS. 9A and 9B, semiconductor dies 1 are manufactured.

That is, as described above, the semiconductor dies 1 are manufactured by removing the support wafer and the temporary adhesive (not illustrated) from the Si wafer 11 on which the TSVs 26, the back side wiring layers 27 and the bumps 30 are formed, and separating the semiconductor dies 1 through, for example, dicing. As described above, since the wafer 11 is thinned, the semiconductor dies 1 are also thinned. Therefore, the semiconductor dies 1 may also be referred to as thinned semiconductor dies or thinned dies.

Figure 9A:
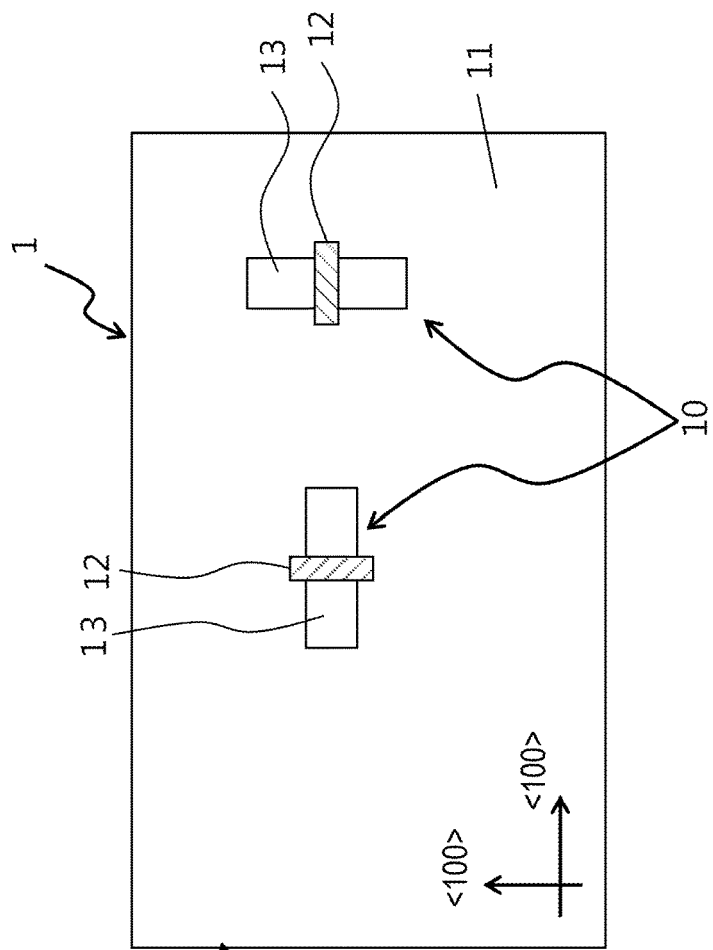
Figure 9B:
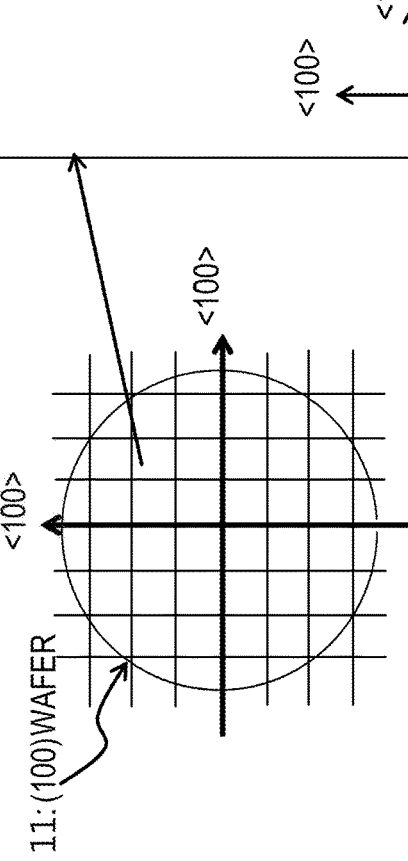

Here, as described above, since respective transistors constituting the CMOS transistors 10 are provided such that the channels 13 are directed along the <100> orientation, and the wiring 18 is also basically formed to be directed along the <100> orientation, as illustrated in FIGS. 9A and 9B, during the dicing, the semiconductor dies 1 are basically separated by cutting the semiconductor dies in a direction aligned with the <100> orientation.

Figure 10A:
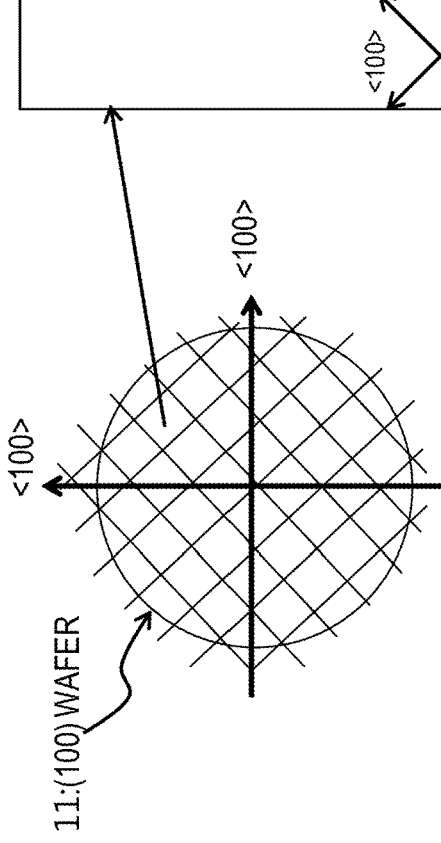
Figure 10B:
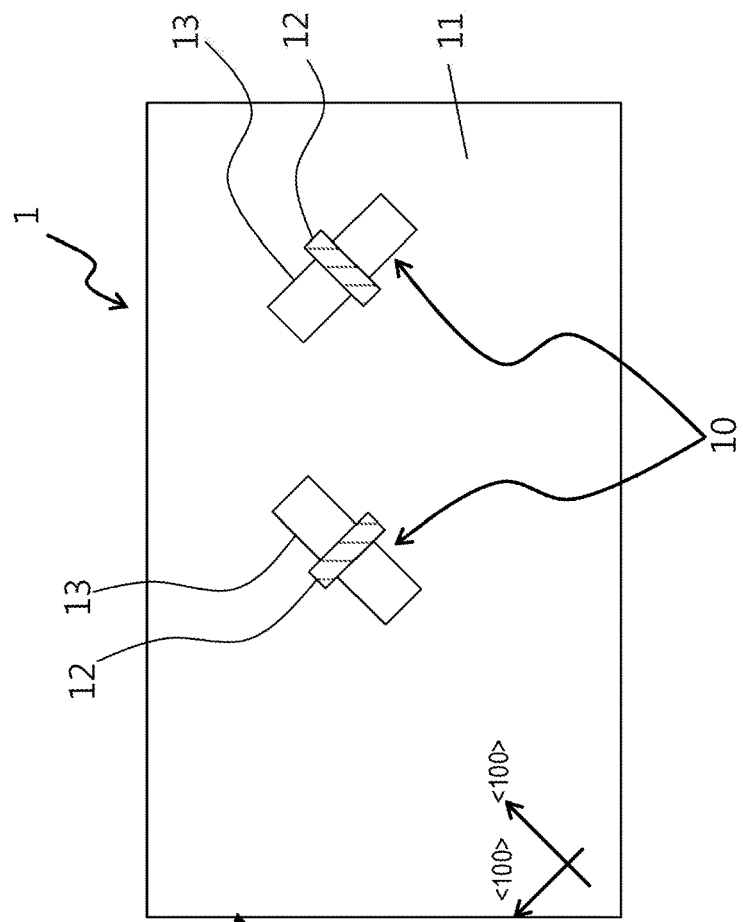

However, a semiconductor die 1 stacked such that the crystal orientation thereof is different from those of the other layers constituting a stacked device (here, the semiconductor die 1 which is the lowermost layer of the stacked device 2) is cut in a direction forming an angle with respect to the direction aligned with the <100> orientation (here, a direction forming an angle of 45° or a direction aligned with the <110> orientation) in the wafer 11 and separated from the wafer 11, as illustrated in FIG. 10A. The obliquely cut die is rotated by 45° and stacked to another die, as illustrated in FIG. 10B.

That is, the semiconductor die 1 stacked such that the crystal orientation thereof is different from those of the other layers constituting the stacked device (here, the semiconductor die 1 which is the lowermost layer of the stacked device 2) is cut and separated in a direction forming an angle with respect to the direction aligned with the <100> orientation (here, a direction aligned with an angle of 45° or a direction aligned with the <110> orientation), and stacked to another layer in the state of being rotated by 45°, so that the semiconductor die 1 which becomes another layer of the stacked device 2 is cut in a direction aligned with the <100> orientation, separated and stacked without being rotated.

Here, since a plurality of semiconductor dies 1 is manufactured by being separated from the Si wafer (Si substrate) 11 having a (100) plane orientation, it means that the plurality of semiconductor dies 1 uses the Si substrates having the (100) orientation. Here, since transistors are provided such that channels thereof are aligned with the <100> orientation before the semiconductor dies 1 are cut, so that the channel directions of the plurality of semiconductor dies 1, including the channel direction of the die stacked with another semiconductor die 1 which is rotated by rotating the cut direction thereof, are aligned with the <100> orientation.

As illustrated in FIGS. 11A and 11B, the stacked device 2 is manufactured by stacking the plurality of semiconductor dies 1 separated as described above and joining the semiconductor dies 1, for example, using a bonder, a reflow furnace, or the like. Here, a plurality of semiconductor dies 1 using the Si substrate having the (100) plane orientation is cut in a direction in which the <100> orientation of the lowermost semiconductor die 1 is rotated by 45° with respect to other layers and stacked in the state of being rotated by 45°. That is, at least one layer is stacked on a convex side of warping in a state in which the in-plane <100> orientation is rotated with respect to the other layers by 45°.

In this way, by rotating dies, which are such that the <100> orientation of the lowermost semiconductor die 1 is in the state of being rotated by 45° with respect to other layers, by 45° and stacking the dies so as to suppress the warping of the stacked device 2, it is possible to manufacture a device in which poor reliability due to defective joining or stress is suppressed is able to be manufactured. Here, although only the lowermost semiconductor layer 1 is made to be in a state in which the <100> orientation is rotated by 45° with respect to the other layers when stacking the plurality of semiconductor dies 1 manufactured using a (100) plane Si substrate, the disclosure is not limited thereto. For example, not only one layer, but also a plurality of layers may be in the state of being rotated, and in the case of the (100) plane Si substrate, there may be a difference ranging from 15° to about 45° between the rotated angles. The rotation by 45° or more is the same as the rotation by 45° or less. Precisely, when assuming a rotating angle is φ°, the rotation by φ° and the rotation by 90-φ° are the same.

Figure 12A:
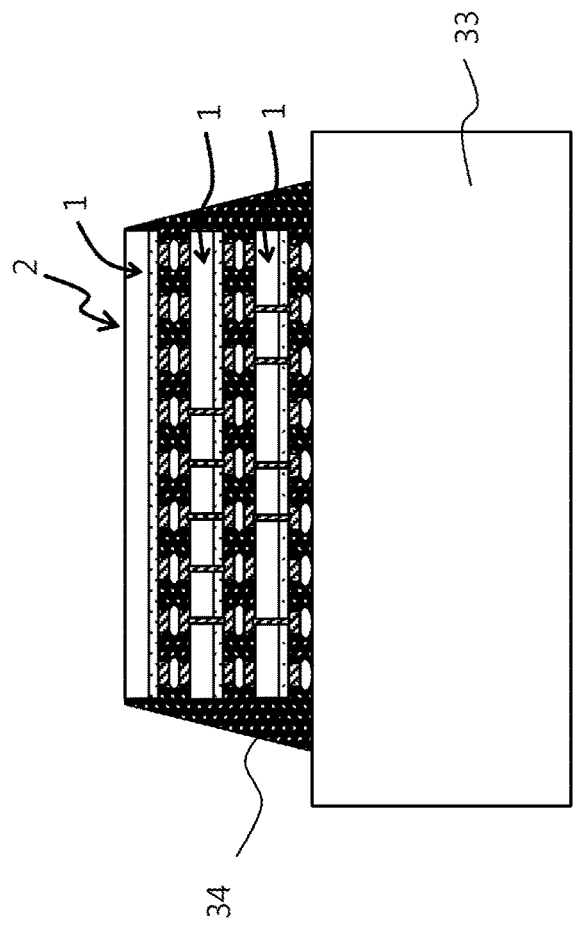
Figure 12B:
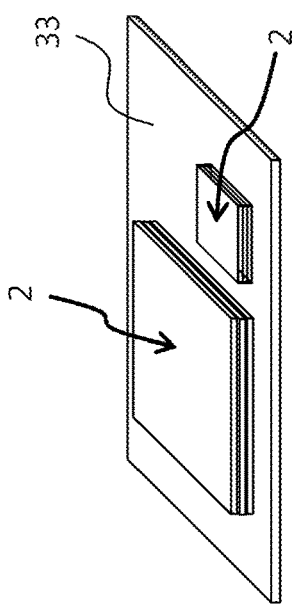

In this manner, the plurality of semiconductor dies 1 which uses semiconductor substrates the plane orientations of which are the same may be stacked such that at least one layer has a different crystal orientation. The plurality of semiconductor dies 1 may be stacked in a state in which the in-plane <100> orientation of at least one layer is rotated with respect to other layers by about 15° to about 45°. Finally, as illustrated in FIGS. 12A and 12B, a semiconductor device may be manufactured by joining the stacked device 2 to, for example, a package substrate or an interposer 33, and filling a gap in joined portions, for example, with an underfill material 34 or the like.

Here, although the thinned semiconductor dies 1 in each of which a TSV 26 is formed are stacked and joined using solder bumps 23 and 30, the present disclosure is not limited thereto. For example, instead of using the solder bumps, the thinned semiconductor dies may be joined through direct bonding of respective Cu pillars. Further, an insulating layer and a planarized wiring (or a pad) (e.g., made of Cu) may be formed on the surfaces of the thinned semiconductor dies 1, and may be joined through hybrid bonding or the like which joins the insulating layer and the wiring simultaneously. In addition, the TSVs may be formed after stacking the semiconductor dies.

In addition to the method described above, there is also a method of thinning and providing a via 35 after joining semiconductor wafers 11. In this case, first, similar to the method described above, a first Si wafer 11A having a circuit including the CMOS transistor 10, the wiring layer (BEOL) 16, or the like is fixed onto a support wafer with a temporary adhesive, and as illustrated in FIG. 13A, the Si substrate is thinned from the back side thereof through, for example, BG, CMP, or the like. However, here, the thickness of the Si wafer (Si substrate) 11A is thinned, for example, to a thickness of about 10.

Next, similar to the method described above, as illustrated in FIG. 13B, a second Si wafer 11B on which a circuit including CMOS transistors 10, a wiring layer (BEOL) 16, or the like (here, a bump 23 or the like is not formed on the surface and the surface is planarized) is bonded to the thinned surface of the back side of the first Si wafer 11A which is thinned as described above. Here, the bonding may be direct bonding of the insulating layer and Si or the like, or may use an organic resin such as bisbenzocyclobutene (BCB) as adhesive.

Next, the Si substrate is thinned, for example, to a thickness of about 10 μm from the back side of the bonded second Si wafer 11B through, for example, BG, CMP, or the like. Then, as illustrated in FIG. 14A, a contact hole is formed from the back side of the thinned second Si wafer 11B using, for example, dry etching or the like, and a via hole 35 is formed using, for example, Cu or W.

Next, similar to the method described above, as illustrated in FIG. 14B, a third Si wafer 11C, on which a circuit including the CMOS transistor 10 and a wiring layer (BEOL) 16 are formed (here, the surface is planarized without forming the bump 23 thereon), is bonded with the back side of the second Si wafer 11B. Here, the case in which three layers of Si wafers 11A to 11C are stacked is described by way of an example. Thus, in the stacked device 2 manufactured by stacking a plurality of semiconductor dies 1 separated from the stacked Si wafers 11A to 11C, a portion separated from the third Si wafer 11C becomes the lowermost layer. Therefore, the third Si wafer 11C is bonded in the state in which the <100> orientation is rotated by 45° with respect to the other layers. In this way, the same effect as the method described above may be obtained.

Here, the bonding may be performed using direct bonding of an insulating layer and Si or the like, or an organic resin such as BCB or the like may be used as an adhesive. Here, Cu pads (Cu electrodes) are exposed on the surface of the third Si wafer 11C, and connected to the plurality of vias 35 through hybrid bonding. Further, although the case in which three layers of Si wafers 11A to 11C are stacked is described here by way of an example, the present disclosure is not limited thereto. More Si wafers may be stacked to manufacture a stacked semiconductor wafer. In this case, processes similar to those as described above may be performed repeatedly.

Here, although the back surface of each of the wafers 11A to 11C is formed of Si, for example, an insulating film of SiO, a resin, or the like, or a wiring (rewiring) of Cu or the like may be formed thereon. Then, the support wafer and the adhesive are removed, for example divided (separated) through dicing so as to manufacture a stacked device 2 in which a plurality of semiconductor dies 1 is stacked. Finally, similar to the method described above, a semiconductor device may be manufactured by joining the stacked device 2 to, for example, a package substrate or an interposer 33, and filling a gap in the joint portion with, for example, an underfill material 34 or the like (see, e.g., FIGS. 12A and 12B).

Therefore, a semiconductor device and a method of manufacturing the same according to the present embodiment has effect of suppressing yield or reliability from deteriorating due to defective joining, by suppressing warping in the case in which a plurality of semiconductor dies 1, in each of which the substrate is thinned, is stacked. In the embodiment described above, although a case where the semiconductor substrate is a (100) plane Si substrate, and a plurality of semiconductor dies 1 is stacked in a state in which the in-plane <100> orientation of at least one layer is rotated by 15° to 45° with respect to the other layers has been described by way of an example, the present disclosure is not limited thereto.

Figure 15:
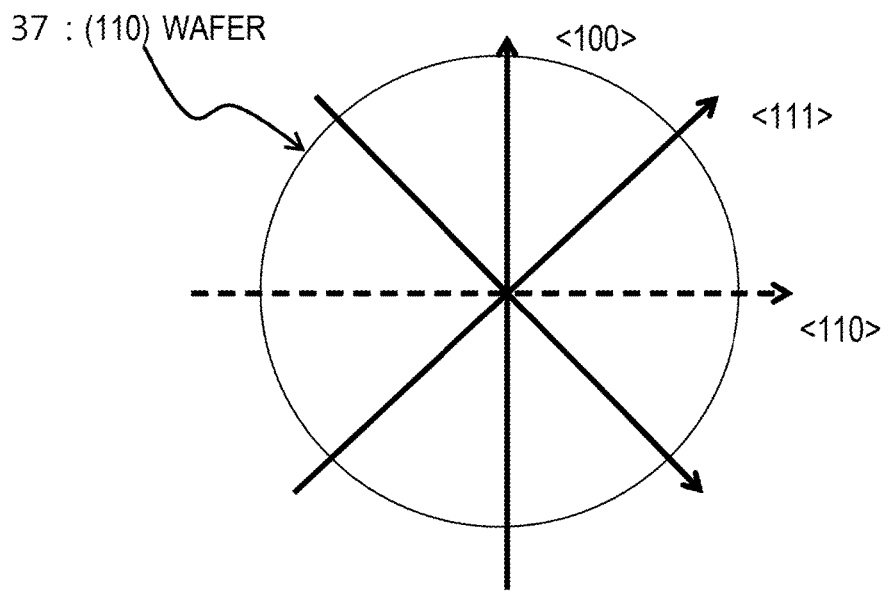
FIG. 15 is a view illustrating an example of a <100> orientation, a <110> orientation, and a <111> orientation in a SI wafer having a (100) plane orientation.

For example, the semiconductor substrate may be a (110) plane Si substrate, and a plurality of semiconductor dies may be stacked in the state in which an in-plane <100> orientation of at least one layer is rotated by 15° to 90° with respect to the other layers. The same effect as the embodiment described above may be obtained in this case as well. In this case, when a (110) plane Si wafer 37 as illustrated in FIG. 15 is used, and semiconductor dies 1 are formed by separating the (110) plane Si wafer 37 through, for example, dicing or the like, the semiconductor substrates constituting the semiconductor dies 1 are the (110) plane Si substrates. Further, a <100> orientation, a <110> orientation, and a <111> orientation in a (110) plane Si wafer 37 are as illustrated in FIG. 15.

In this case, in the staking process of the method of manufacturing a semiconductor device, a plurality of semiconductor dies 1 each using a (100) plane Si substrates as the semiconductor substrate may be stacked in a state in which the in-plane <100> orientation of at least one layer is rotated by 15° to 90° with respect to the other layers. Particularly, at least one layer may be stacked on a convex side of warping in a state in which the in-plane <100> orientation is rotated by 45° with respect to the other layers.

In this case, in the stacking process of the method of manufacturing a semiconductor device, at least one layer may be stacked on a convex side of warping in a state in which the in-plane orientation <100> thereof is rotated by 90° with respect to the other layers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a plurality of semiconductor dies formed using semiconductor substrates, plane orientations of which are the same, and stacked such that a crystal orientation of at least one layer is different from other layers.

2. The semiconductor device according to claim 1, wherein the semiconductor substrates are a (100) plane Si substrate, and the plurality of semiconductor dies are stacked in a state in which an in-plane <100> orientation of at least one layer is rotated by 15° to 45° with respect to other layers.

3. The semiconductor device according to claim 1, wherein the semiconductor substrates are (110) plane Si substrates, and the plurality of semiconductor dies are stacked in a state in which an in-plane <100> orientation of at least one layer is rotated by 15° to 90° with respect to other layers.

4. The semiconductor device according to claim 2, wherein the at least one layer is stacked on a convex side of warping in a state in which the in-plane <100> orientation thereof is rotated by 45° with respect to the other layers.

5. The semiconductor device according to claim 2, wherein the at least one layer is stacked on a convex side of warping in a state in which the in-plane <100> orientation thereof is rotated by 90° with respect to the other layers.

6. The semiconductor device according to claim 2, wherein each of the plurality of semiconductor dies includes a transistor provided such that a channel of the transistor is directed along the <100> orientation.

7. A method of manufacturing a semiconductor device, comprising:
stacking a plurality of semiconductor dies formed using semiconductor substrates, plane orientations of which are the same, such that at least one layer has a different crystal orientation.

8. The method according to claim 7, wherein, in the stacking, the plurality of semiconductor dies using a (100) plane Si substrate as the semiconductor substrate is stacked in a state in which an in-plane <100> of at least one layer is rotated by 15° to 45° with respect to other layers.

9. The method according to claim 7, wherein, in the stacking, the plurality of semiconductor dies using a (110) plane Si substrate as the semiconductor substrate is stacked in a state in which an in-plane <100> orientation of at least one layer is rotated by 15° to 90° with respect to other layers.

10. The method according to claim 8, wherein, in the stacking, the at least one layer is stacked on a convex side of warping in a state in which the in-plane <100> is rotated by 45° with respect to other layers.

11. The method according to claim 9, wherein, in the stacking, the at least one layer is stacked on a convex side of warping in a state in which the in-plane <100> orientation is rotated by 90° with respect to other layers.

12. The method according to claim 8, comprising:
   manufacturing the plurality of semiconductor dies including a transistor provided such that a channel is directed along the <100> orientation, before the stacking.

* * * * *